(12) United States Patent
Kazakevich et al.

(10) Patent No.: US 7,233,624 B2
(45) Date of Patent: Jun. 19, 2007

(54) METHOD AND SYSTEM FOR ALL DIGITAL GAIN CONTROL

(75) Inventors: Leonid Kazakevich, Plainview, NY (US); Rui Yang, Greenlawn, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 832 days.

(21) Appl. No.: 10/330,749

(22) Filed: Dec. 27, 2002

(65) Prior Publication Data

US 2003/0228853 A1 Dec. 11, 2003

Related U.S. Application Data

(60) Provisional application No. 60/388,122, filed on Jun. 11, 2002.

(51) Int. Cl.
*H04B 14/04* (2006.01)
(52) U.S. Cl. .............. 375/243; 375/245; 375/246; 341/110; 341/200; 704/230
(58) Field of Classification Search ............... 375/240, 375/243, 245, 246; 341/110, 126, 155, 200; 348/384, 404, 405, 406, 572; 704/225, 230, 704/500, 503
See application file for complete search history.

(56) References Cited

U.S. PATENT DOCUMENTS

| | | | |
|---|---|---|---|
| 4,025,732 A | 5/1977 | Traunmüller | |
| 4,124,773 A | 11/1978 | Elkins | |
| 4,132,985 A | 1/1979 | Kitaura | |
| 4,189,625 A * | 2/1980 | Strandberg | 375/240 |
| 4,250,470 A | 2/1981 | Szarvas | |
| 4,903,020 A | 2/1990 | Wermuth et al. | |
| 5,446,761 A | 8/1995 | Nag et al. | |
| 5,572,452 A | 11/1996 | Ostman et al. | |
| 6,577,262 B1 * | 6/2003 | Veillette | 341/155 |
| 2003/0002576 A1 * | 1/2003 | Whitehead et al. | |

FOREIGN PATENT DOCUMENTS

| | | |
|---|---|---|
| EP | 0 595 406 | 10/1993 |
| JP | 06-164390 | 6/1994 |
| JP | 06-244887 | 9/1994 |
| JP | 09-098036 | 4/1997 |
| JP | 12-236276 | 8/2000 |
| JP | 2000 236276 | 8/2000 |

* cited by examiner

*Primary Examiner*—Dac V. Ha
(74) *Attorney, Agent, or Firm*—Volpe and Koenig, P.C.

(57) ABSTRACT

An analog/digital gain control device avoid some of the requirements associated with the nature of a closed-loop AGC circuits and which meets the remaining requirements without much difficulty uses an analog to digital conversion method that increases the number of effective ADC bits by compressing the baseband input analog signal using a logarithmic circuit. After the compressed analog signal is converted into a digital signal, a digital anti-log process or look-up table (LUT) is used to expand the digital signal back to the original linear scale. The word size of the output of the anti-log process is larger than the input word size due to the nature of the anti-log function. To reduce the word size of the digital signal an open loop normalization technique can be applied.

13 Claims, 3 Drawing Sheets

METHOD AND SYSTEM FOR ALL DIGITAL GAIN CONTROL

CROSS REFERENCE TO RELATED APPLICATION(S)

This application claims priority from U.S. provisional patent application no. 60/388,122 filed on Jun. 11, 2002 which is incorporated by reference as if fully set forth.

FIELD OF INVENTION

The present invention relates to the field of wireless communications. More specifically, the present invention relates to an all digital gain control architecture.

BACKGROUND

In most wireless communication systems, the baseband signal at a receiver is converted from analog format into digital format so that the useful information can be recovered via a sequence of digital processes. The common device that achieves this conversion is an analog-to-digital converter (ADC). One of the most important specifications of an ADC is the number of output bits. In general, the more output bits the ADC has, the larger the dynamic range of the input signal the ADC can support. However, this results in a more expensive ADC, as well as the rest of the receiver components. Given the number of output bits, if the power of the input signal is too large, the output of the ADC may be saturated. On the other hand, if the power of the input signal is too small, the input signal may be severely quantized. In both of these cases, the information to be recovered at the receiver may be lost. A common approach to solve this problem is to apply a dynamically adjustable gain amplifier in front of the ADC so that the input signal of the ADC can be maintained at a desired level. Typically, the adjustable gain is controlled using a closed-loop mechanism, as shown in FIG. 1, which is also called automatic gain control (AGC).

In practice, several requirements need to be considered when using AGC. AGC should be sufficiently fast to compensate for channel loss variation, but should be slow enough so as not to distort the signal envelope. AGC should not change the insertion phase of the radio (so as not to overload the de-rotation loop). AGC should also have a linear response (in dB-per-Volt). AGC is a closed-loop control system, so it has stability, settling time and overshoot concerns as well as other design issues to be considered. AGC is required to have control lines from the modem and often an additional digital-to-analog converter (DAC). In time division duplex (TDD) and Time Division Multiple Access (TDMA) modes, the AGC has to re-adjust the radio gain very fast upon the occurrence of a big unknown step in incoming power. AGC requires a specific radio architecture with gain control, both of which add cost and power consumption. AGC also has design trade offs between NF and IP3 especially in the presence of a bigjammer. IP3 is a third order intercept point. NF is a noise figure. The higher the gain before the down-converter (demodulator) the better (lower) the NF, but the IP3 is also lowered (which is not good). In practice, some of the above requirements are difficult to achieve. Certain trade-offs have to be made, resulting in a loss of a certain amount of system level performance.

SUMMARY

The present invention overcomes the problems confronting the techniques presently in use by compressing an input analog signal at baseband and employing a logarithmic technique, converting the compressed signal into digital form and expanding the digital signal to its original linear scale using an antilog technique. Word size of the expanded digital signal may be reduced by a normalization technique.

BRIEF DESCRIPTION OF THE INVENTION

DETAILED DESCRIPTION OF THE PREFERRED EMBODIMENTS

Figure 1:
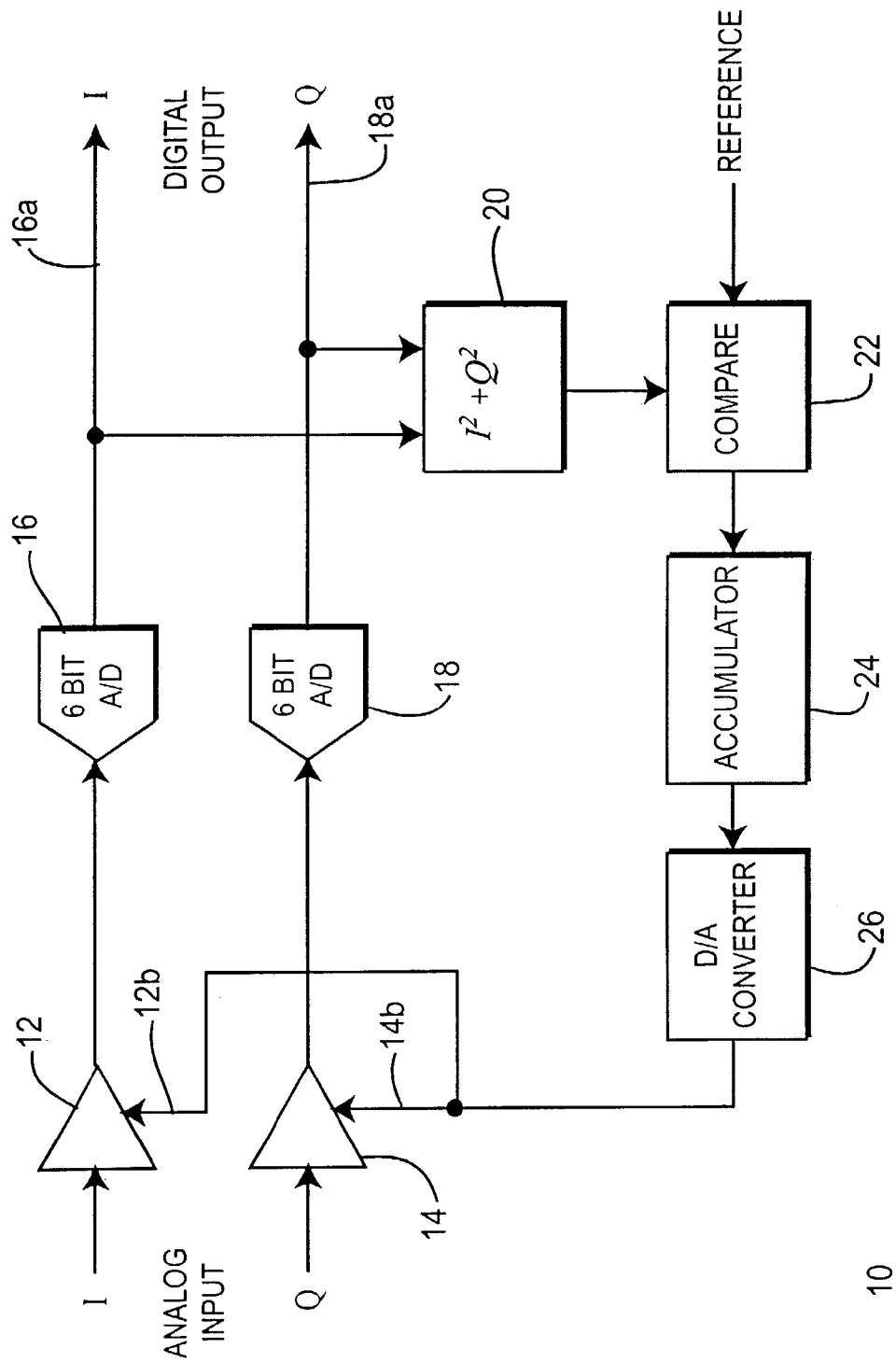
FIG. 1 is a block diagram of a prior art closed-loop AGC.

FIG. 1 shows a prior art closed-loop automatic gain control (AGC) circuit 10 in which analog inputs of in-phase (I) and quadrature (Q) signals are respectively applied to amplifiers 12 and 14. The outputs thereof undergo analog to digital conversion through A/D converters 16, 18 which are shown in the figure as, (e.g.,6 bit), A/D converters, providing I and Q outputs at 16a and 18a, respectively.

The outputs of A/D converters 16 and 18 are applied to circuit 20 to obtain a sum of $I^2+Q^2$ which is then compared to a reference level in comparison circuit 22. The output of comparison circuit 22 is applied to a digital-to-analog converter (DAC) 26 through an accumulator 24 and respectively applied to the gain control inputs 12b, 14b of the gain control amplifiers 12 and 14.

The all digital gain control (ADGC) device 30 of the present invention avoids some of the requirements associated with the nature of the closed-loop AGC circuitry described above, and meets the remaining requirements without too many difficulties. The present invention employs an analog-to-digital conversion method that increases the number of effective ADC bits by compressing the baseband input analog signal using an analog compressor, e.g., logarithmic circuitry. The analog compressor is a nonlinear device where the gain is inversely proportional to the input signal. This increases the dynamic range of the analog input signal.

After the compressed analog signal is converted into a digital signal, a digital expander, e.g. anti-log process or look-up table (LUT), is used to expand the digital signal back to the original linear scale. The digital expander is a nonlinear device where the gain is proportional to the input signal. The word size of the output of the expander may be larger than the input word size due to the nature of the functionality of most expanders. To reduce the word size of the digital signal for the reset of the receiver, a normalization mechanism can be applied, which could be an open loop or closed loop automatic level control block.

Figure 2:
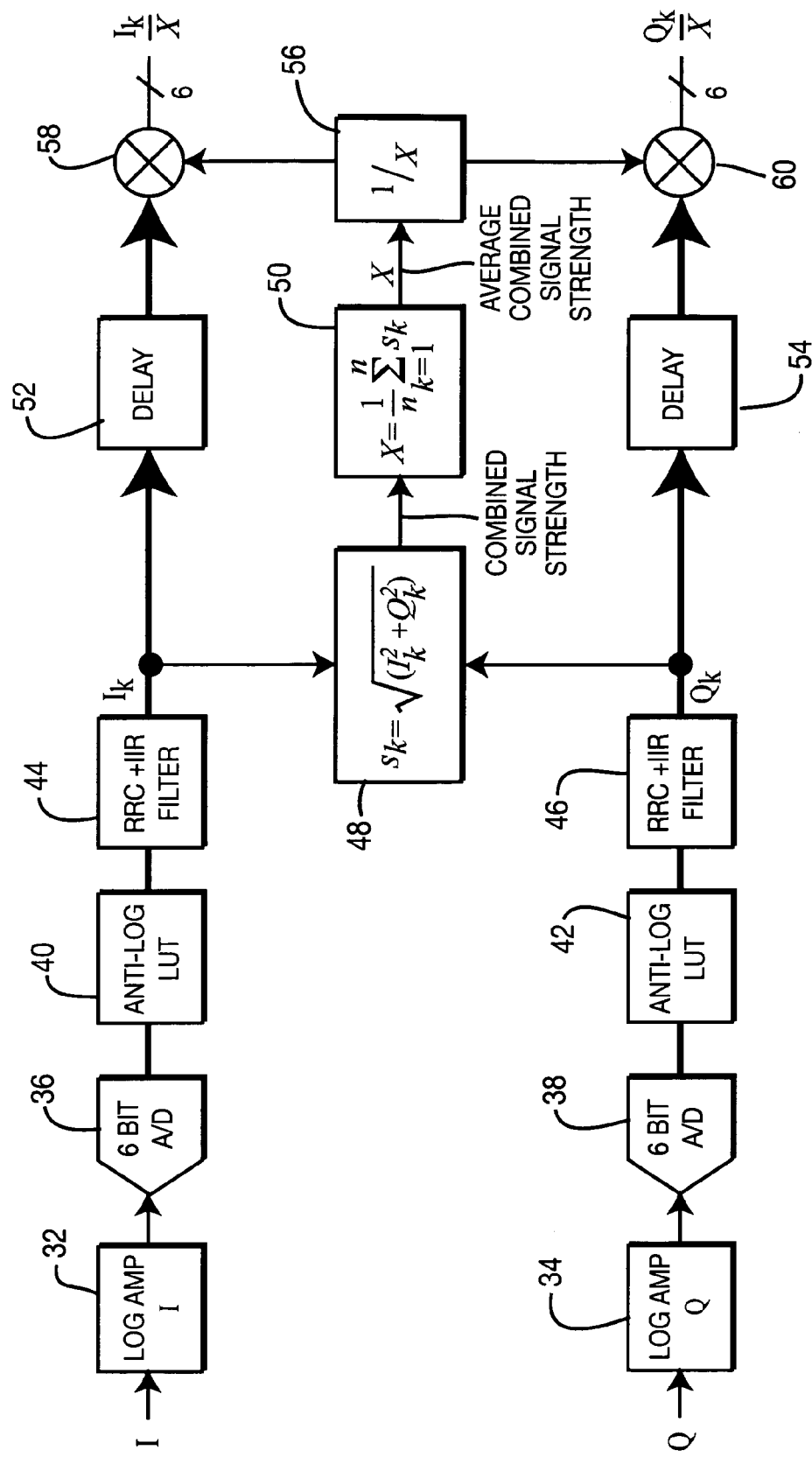
FIG. 2 is a block diagram of the all digital gain control (ADGC) using true log amplifiers as compressors and anti-log look-up-table (LUT) as expanders.

FIG. 2 shows a block diagram of the ADGC device 30 of the present invention. The ADGC device employs logarithmic amplifiers 32, 34 for logarithmic amplification of the I and Q signals which are then passed to (e.g., 6 bit), analog-to-digital converters 36, 38 and thereafter passed to anti-log lookup tables (LUTs) 40 and 42 to expand the digital signal and then subsequently passed to a low pass filter, (e.g., root-raised cosine infinite impulse response (RRC+IIR) filters 44, 46, each of which is used as an interpolator).

Outputs of filters 44 and 46 are applied to circuitry 48 which determines the combined signal strength of the I and Q channels. The combined signal strength of the I and Q channels is output from circuitry 48 to circuitry 50 which determines the averaged combined signal strength measurements from both the I and Q channels before reducing the number of bits of the digital signal. Circuitry 50 uses Equation 1 to determine the averaged combined signal strength X with a block-by-block scheme as follows:

$$X = \frac{1}{n}\sum_{i=1}^{n} s_i(t) \qquad \text{Equation (1)}$$

where n is the size of the block, $s_k$ is the square root of the sum of $I_k^2$ and $Q_k^2$, and $I_k$ and $Q_k$ for k=1, . . . , n are n-sample outputs of the filters 44 and 46, respectively. The outputs of filters 44 and 46 are delayed by delay circuits 52 and 54 with n samples in order to synchronize the timing between the outputs of the filters 44 and 46 to enable completion of the functions performed by a normalization circuit which includes the circuits 48, 50 and 56. As result, the output of multiplier 58 is:

$$\frac{I_k}{X}; \qquad \text{Equation (2)}$$

and the output of multiplier 60 is:

$$\frac{Q_k}{X}, \qquad \text{Equation (3)}$$

where $I_k$ and $Q_k$ for k=1, . . . , n are n-sample outputs of the filters 44 and 46, respectively, and X is defined by Equation (1).

According to the present invention, an instantaneous dynamic range of 70 dB is easily achievable. An additional 20 to 30 dB can be obtained by switching the LNA on or off. The ADGC device 30 does not require any gain control in the radio, thereby providing benefits of cost and-simplicity. Large instantaneous power variation can be easily supported by the ADGC device 30. The ADGC device 30 also provides good support for high speed down link and packet transmission. Furthermore, since the ADGC device 30 of the present invention is open loop, there are no stability problems, no settling time and no overshoot. ADGC 30 need not have any knowledge about the timing of the signal, which is very important in cell search, code acquisition and frequency correction mode in a system using TDD technology.

The ADGC device 30 provides very fast fading compensation without distorting the signal envelop, which helps avoid the problems encountered with high speeds and/or high data rates, but does not change the insertion phase of the system.

Figure 3:
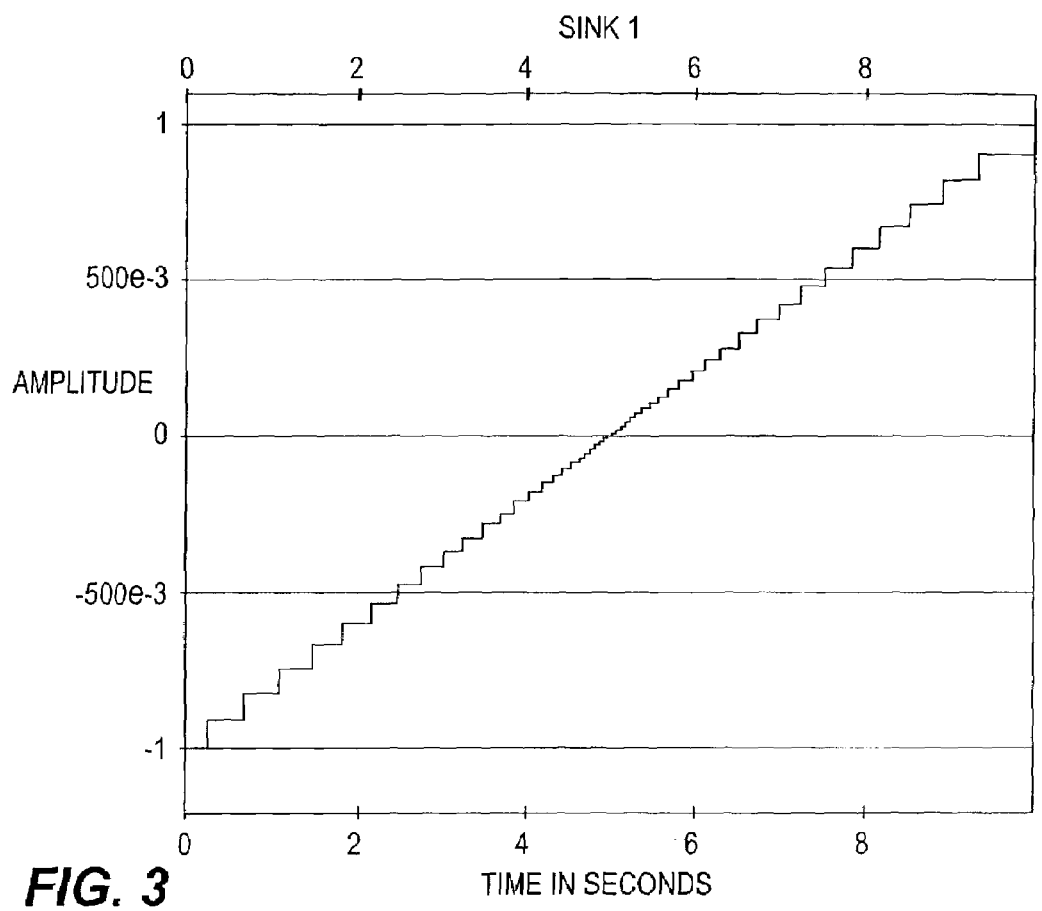
FIG. 3 is a graph depicting the result of analog compression and digital expansion.

The result of analog compression and digital expansion is shown in FIG. 3. In this figure, the stair curve represents the relation of the input of the analog compressor and the output of digital expander. It is clear that, using an analog compression and digital expansion technique, a signal with small magnitude can be quantized with a very small quantization step. This will generate very small quantization noise and, as result, will improve the performance of the receiver.

Figure 4:
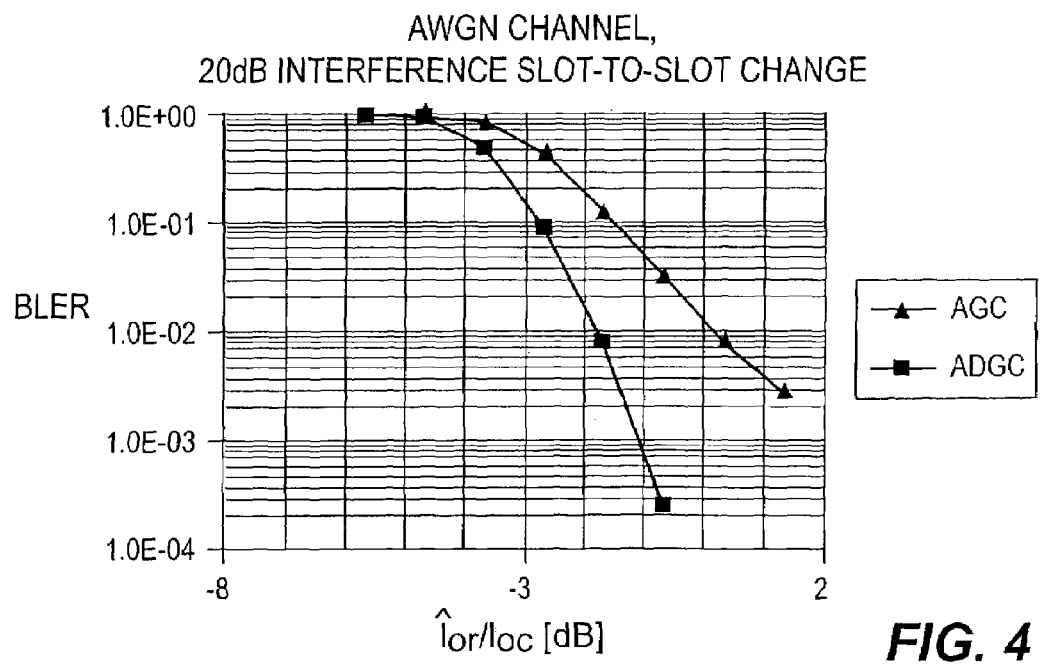
FIG. 4 illustrates the improvement of performance for a communication system by a comparison between ADGC and traditional AGC.

To observe the improvement of the performance for a communication system, a comparison between the ADGC device 30 of the present invention and a traditional AGC circuit is made using a TDD downlink simulation test bench with ideal multi-user detector and an added white Gaussian noise channel. The simulation result is shown in FIG. 4. In this test bench, the input signal undergoes 20 dB slot-to-slot power variation. Here we see that ADGC device 30 of the present invention improves the system performance by nearly 2 dB at a block error rate (BLER)=0.01.

What is claimed is:

1. A gain controller for obtaining wide range and high resolution analog-to-digital conversion of an in-phase (I) signal and a quadrature (Q) signal, the gain controller comprising:
   (a) a first analog compressor for compressing the I signal into a compressed analog I signal;
   (b) a first analog-to digital (A/D) converter electrically coupled to an output of the first analog compressor for converting the compressed analog I signal into a compressed digital I signal;
   (c) a first expander electrically coupled to an output of the first A/D converter for expanding the compressed digital I signal back to an original linear scale;
   (d) a second analog compressor for compressing the Q signal into a compressed analog Q signal;
   (e) a second A/D converter electrically coupled to an output of the second analog compressor for converting the compressed analog Q signal into a compressed digital Q signal;
   (f) a second expander electrically coupled to an output of the second A/D converter for expanding the compressed digital Q signal back to an original linear scale;
   (g) a first low pass filter electrically coupled to an output of the first expander for filtering the output of the first expander to generate a filtered I signal;
   (h) a second low pass filter electrically coupled to an output of the second expander for filtering the output of the second expander to generate a filtered Q signal; and
   (i) a normalization circuit coupled to outputs of the first and second low pass filters for adjusting the gain of the filtered I and Q signals on a block-by-block basis as a function of averaged combined signal strength measurements of the filtered I and Q signals.

2. The gain controller of claim 1 wherein the first and second compressors are logarithmic amplifiers.

3. The gain controller of claim 1 wherein the first and second expanders are anti-log look-up tables (LUTs).

4. The gain controller of claim 1 wherein the normalization circuit reduces word size of the filtered I and Q signals.

5. The gain controller of claim 1 wherein each of the first and second low pass filters is a root-raised cosine (RRC) filter.

6. The gain controller of claim 1 wherein each of the first and second low pass filters is an infinite impulse response (IIR) filter.

7. The gain controller of claim 1 further comprising:
   (j) a first delay circuit electrically coupled to an output of the first low pass filter for outputting a delayed filtered I signal;
   (k) a second delay circuit electrically coupled to an output of the second low pass filter for outputting a delayed filtered Q signal;

(l) a first multiplier having a first input electrically coupled to an output of the first delay circuit, and a second input electrically coupled to an output of the normalization circuit used to adjust the gain of the delayed filtered I signal, wherein the first multiplier outputs a value substantially equal to the delayed filtered I signal divided by the averaged combined signal strength of the filtered I and Q signals; and (m) a second multiplier having a first input electrically coupled to an output of the second delay circuit, and a second input electrically coupled to an output of the normalization circuit used to adjust the gain of the delayed filtered Q signal, wherein the second multiplier outputs a value substantially equal to the delayed filtered Q signal divided by the averaged combined signal strength of the filtered I and Q signals.

8. A gain control method employed in a communication system for obtaining wide range and high resolution analog-to-digital conversion of an in-phase (I) signal and a quadrature (Q) signal, the method comprising:

(a) compressing the I signal into a compressed analog I signal;

(b) converting the compressed analog I signal into a compressed digital I signal;

(c) expanding the compressed digital I signal back to an original linear scale;

(d) compressing the Q signal into a compressed analog Q signal;

(e) converting the compressed analog Q signal into a compressed digital Q signal;

(f) expanding the compressed digital Q signal back to an original linear scale;

(g) filtering the expanded digital I signal to generate a filtered I signal;

(h) filtering the expanded digital Q signal to generate a filtered Q signal; and (i) adjusting the gain of the filtered I and Q signals on a block-by-block basis as a function of averaged combined power measurements of the filtered I and Q signals.

9. The method of claim 8 wherein the I signal is logarithmically compressed into the compressed analog I signal at baseband.

10. The method of claim 8 wherein the Q signal is logarithmically compressed into the compressed analog Q signal at baseband.

11. The method of claim 8 wherein the compressed digital I signal is logarithmically expanded.

12. The method of claim 8 wherein the compressed digital Q signal is logarithmically expanded.

13. The method of claim 8 further comprising:

(j) delaying the filtered I signal to generate a delayed filtered I signal;

(k) delaying the filtered Q signal to generate a delayed filtered Q signal;

(l) dividing the delayed filtered I signal by the avenged combined signal strength of the filtered I and Q signals; and (m) dividing the delayed filtered Q signal by the averaged combined signal strength of the filtered I and Q signals.

* * * * *

UNITED STATES PATENT AND TRADEMARK OFFICE
CERTIFICATE OF CORRECTION

PATENT NO. : 7,233,624 B2  Page 1 of 1
APPLICATION NO. : 10/330749
DATED : June 19, 2007
INVENTOR(S) : Kazakevich et al.

It is certified that error appears in the above-identified patent and that said Letters Patent is hereby corrected as shown below:

Title page item (57), ABSTRACT, page 1, right column, line 1, after the word "device", delete "avoid" and insert therefor --avoids--.

At column 2, delete line 11, and insert therefor --BRIEF DESCRIPTION OF THE DRAWINGS--.

At column 3, delete Equation (1), and insert therefor $--X = \frac{1}{n} \sum_{k=1}^{n} s_k --.$ At column 3, line 66, before the first use of the words "of the", delete "relation" and insert therefor --relationship--.

Signed and Sealed this

First Day of July, 2008

JON W. DUDAS
*Director of the United States Patent and Trademark Office*